United States Patent [19]

Okada et al.

[11] 3,968,464
[45] July 6, 1976

[54] MULTIPLE TUNING SYSTEM

[75] Inventors: Yoshinori Okada, Kadoma; Terumi Toyoshima, Hirakata; Eizo Mori, Uji, all of Japan

[73] Assignee: Matsushita Electric Industrial Co., Ltd., Osaka, Japan

[22] Filed: Oct. 3, 1974

[21] Appl. No.: 511,526

[52] U.S. Cl. .............................. 334/50; 334/74; 334/89
[51] Int. Cl.² ................... H03J 5/30; H03J 1/06
[58] Field of Search ............... 334/2, 39, 50–51, 334/74, 89

[56] References Cited
UNITED STATES PATENTS

| | | | |
|---|---|---|---|
| 2,611,807 | 9/1952 | Lazzery | 334/50 |
| 2,789,227 | 4/1957 | Murakami et al. | 334/51 |
| 2,898,563 | 8/1959 | De Cola et al. | 334/50 |
| 2,975,276 | 3/1961 | Thias | 334/51 |

FOREIGN PATENTS OR APPLICATIONS

| | | | |
|---|---|---|---|
| 917,203 | 1/1963 | United Kingdom | 334/50 |

Primary Examiner—John K. Corbin
Assistant Examiner—Wm. H. Punter
Attorney, Agent, or Firm—Stevens, Davis, Miller & Mosher

[57] ABSTRACT

A tuner comprising a plurality of cylindrically assembled bases supported between a pair of support plates secured to a rotatable shaft, receiving circuit blocks for receiving waves in different frequency bands being provided in groups on the inner side of said bases, whereby it is possible to reduce the space requirement for the whole tuner construction and make ready adjustment of the individual receiving circuit blocks.

6 Claims, 7 Drawing Figures

HIGH FREQUENCY
CIRCUIT

MULTIPLE TUNING SYSTEM

This invention relates to a tuner comprising a plurality of cylindrically arranged bases held between opposite support discs secured to and rotatable with a shaft, each base being provided on the inner side thereof with a plurality of receiving circuit blocks for receiving antenna output of respectively different frequency bands, the terminal contacts of the individual receiving circuit blocks being led to the outer side of the associated bases to be selectively connected to contact pieces disposed such as to touch the periphery of the drum constituted by the bases for receiving waves in desired frequency bands.

In any type of the usual tuners, the individual receiving circuit blocks are arranged on the same plane, with their terminals led through leads to a select switch for switching individual frequency bands to be received. The arrangement of the individual receiving circuits on the same plane, however, is very disadvantageous from the standpoint of the space factor. Also, long leads are required to connect the terminals to the select switch, giving rise to unnecessary inductances.

Another object of the invention is to provide a simplified tuner construction which permits the adjustment of the individual receiving circuit blocks to be very readily made.

According to the invention, a plurality of bases clad with receiving circuit blocks are arranged into the form of a drum so as to extremely reduce the space requirement and minimize unnecessary inductances due to the leads. Also, the receiving circuit blocks for the respective frequency bands are divided into several groups, and the blocks in each group are provided on the same base. In this way, it is possible to extremely simplify the adjustment of the individual receiving circuit blocks.

The above and other objects, features and advantages of the invention will become more apparent from the following description taken in conjunction with the accompanying drawings, in which.

Figure 3:
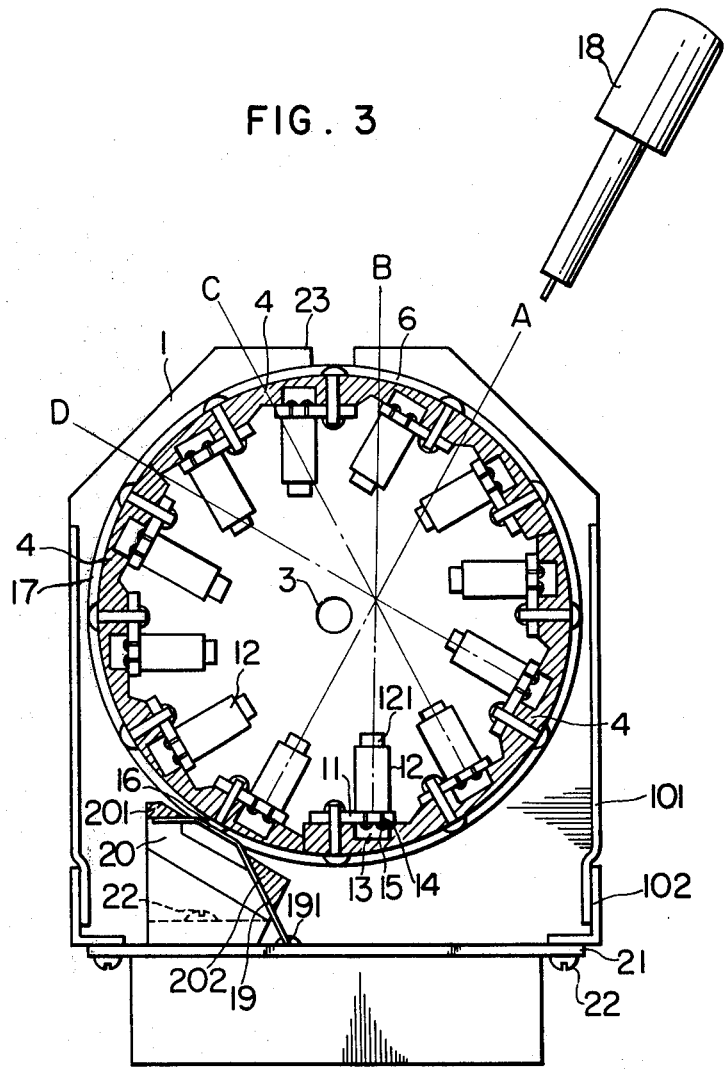
FIG. 3 is a sectional view of the same tuner.
Figure 4:
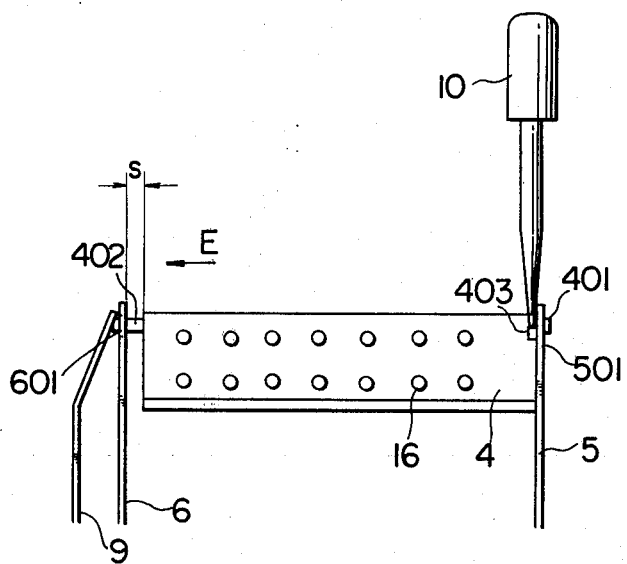
FIGS. 4 and 5 are fragmentary illustrations showing parts of the same tuner.
Figure 6:
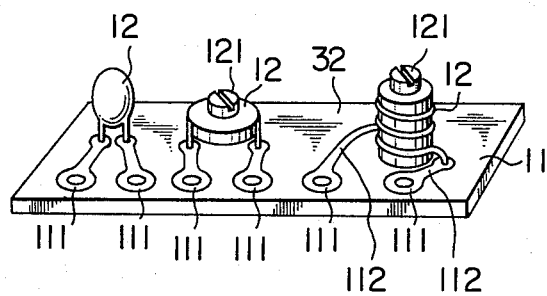
FIG. 6 is a perspective view of a receiving circuit block arranged on a printed circuit base for receiving a wave of a certain frequency band.
Figure 7:
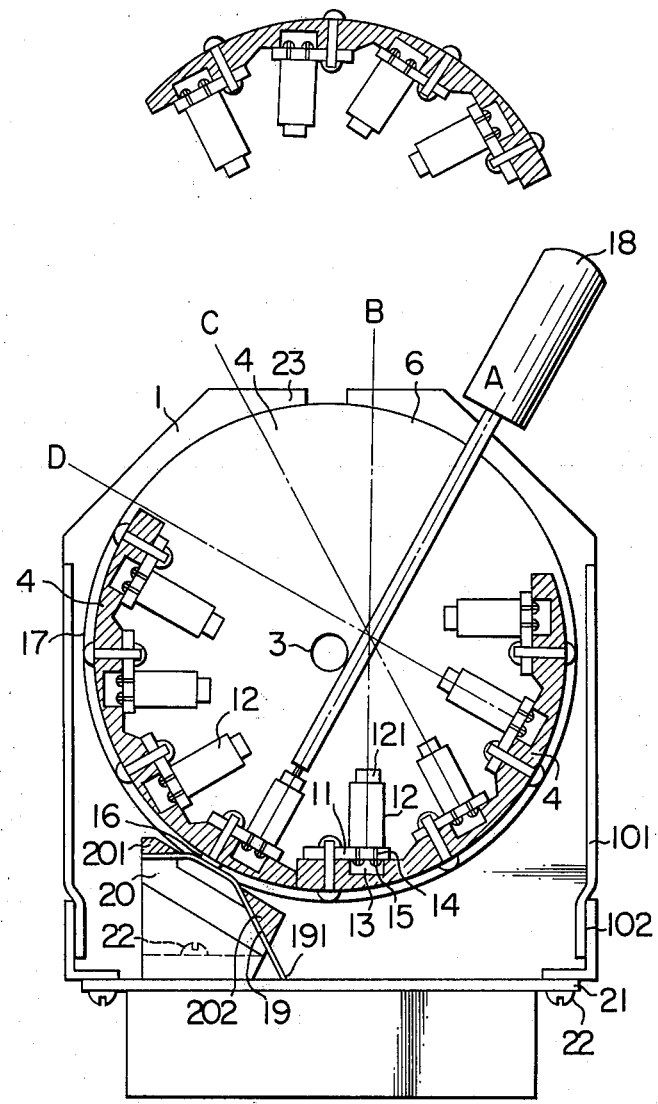
FIG. 7 is a sectional view showing a method of adjusting one of the receiving circuit blocks by inserting an adjusting tool in the tuner.

Referring now to the drawings showing one embodiment of the tuner according to the invention, reference numeral 1 designates a tuner frame provided with a cover 2 for shielding the circuit elements within the tuner frame 1 with bent members 101 and 102 spot welded to each other for reinforcing and preventing deformation of the frame. Rotatably supported in the tuner frame 1 is a shaft 3, which has a pair of support plates 5 and 6 secured to it. Supported between the support plates 5 and 6 are a plurality of arcuate bases 4. The support plates 5 and 6 are provided with respective holes 501 and 601 formed at positions corresponding to projections extending from the opposite ends of the individual bases 4. Each base 4 can be mounted by fitting its projections 401 and 402 in the associated holes 501 and 601. The support plate 6 carries a plate spring 9 secured to its outer side via spacer 7 by means of a set screw 8. The plate spring 9 serves to urge the projection 402 of each base 4 toward the support plate 5. Thus, a certain force in excess of the spring force is required to detach the projection 401 from the hole 501 for removing the base 4 from the support plates 5 and 6. The base 4 is formed adjacent to its end on the side of the support plate 5 with a notch 403, as shown in FIG. 4. The base 4 may be readily removed by forcing it with a driver 10 or like tool inserted in the notch 403 in the direction to urge the plate spring 9, that is, in the direction of arrow E in FIG. 4. The projection 402 has a sufficient length to provide enough space S between support plate 6 and base 4, so that by displacing the base 4 in the direction of arrow E against the spring force of the plate spring 9 the projection 401 can be readily detached from the hole 501. Then, by raising the base 4 the projection 402 can be detached from the hole (see FIG. 4). In this way, the base 4 can be readily removed from between the support plates 5 and 6. Each base 4 is provided on the inner side thereof with a plurality of printed circuit bases 11 on each of which circuit elements 12, such as a coil and the like, are arranged to constitute a receiving circuit block 32, as shown in FIGS. 3 and 6. Each of the receiving circuit blocks 32 constitutes a number of turning elements for receiving a wave of a separate frequency band. 121 designates a core adjustment section in each coil 12. The bases 4 are also provided with recesses 13, each of which serves to accommodate a soldered portion 15 formed by soldering leads of each coil 12 or like element to the base 11. Numeral 16 designates terminal contacts secured to the base 11. They are arranged in rows and the number thereof corresponds to the number of terminals of each receiving circuit block. They are soldered to foils 111 (FIG. 6) of the associated base 11 and are electrically connected through the foils to the associated elements 12 so as to constitute the terminals of each receiving circuit block and to secure the printed circuit base to the base 4.

The elements 12 assembled on the printed circuit bases 11 have their portions requiring adjustment orientated such that the extensions A, B, C, D, ... of these portions deviate from the shaft 3 (see FIG. 3). In this embodiment, the drum or rotor indicated at 17 consists of three bases 4 each carrying four receiving circuit blocks for receiving four different frequency bands, the individual blocks having respective terminal contacts 16, so that twelve different frequency bands can be selectively received. By removing one base 4, the adjustment of four receiving circuit blocks may be done very easily with an adjustment tool 18 (see FIG. 3).

Numeral 19 designates contact pieces which are arranged in a row and disposed at positions corresponding to the terminal contacts 16 in each row. Numeral 20 designates a contact piece retainer made of an insulating material such as a synthetic resin for restricting the movement of the contact pieces 19 by its keep faces 201, 202, 203 and 204 such that the contact pieces can be moved in no direction other than that of flexure. Numeral 21 designates a printed circuit base, which is secured by means of set screws 22 to the tuner frame 1. The printed circuit base 21 carries a high frequency circuit 212 including a variable capacitor 211 and other elements. The contact pieces 19 are soldered at one 191 end to the printed circuit base 21, so that the afore-mentioned individual receiving circuit blocks can be coupled through the terminal contacts 16 and contact pieces 19 to the high frequency circuit 212.

Figure 1:
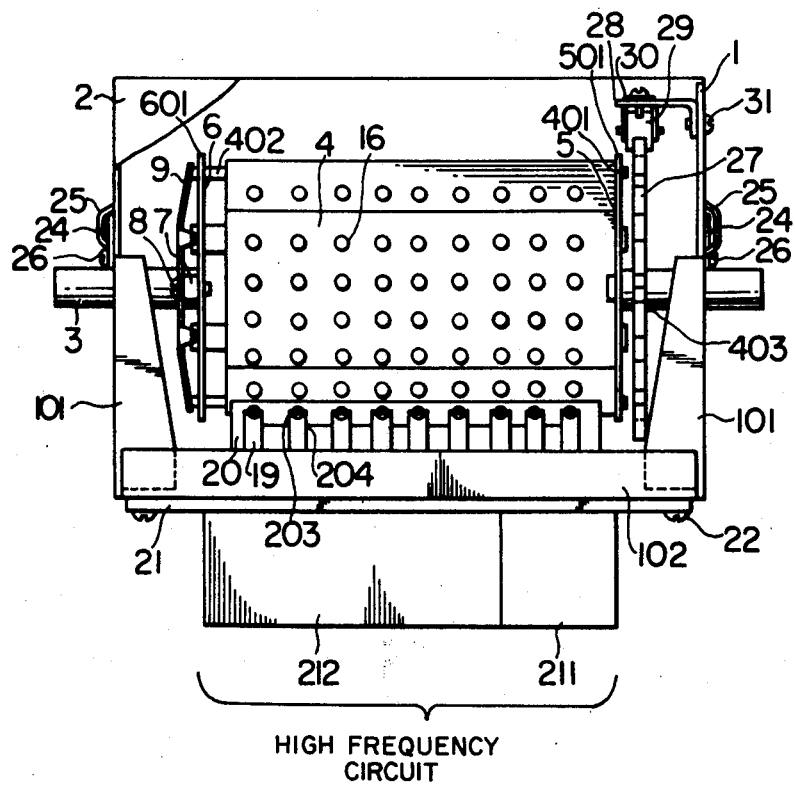
FIG. 1 is a front view, partly broken away, showing an embodiment of the tuner according to the invention.
Figure 2:
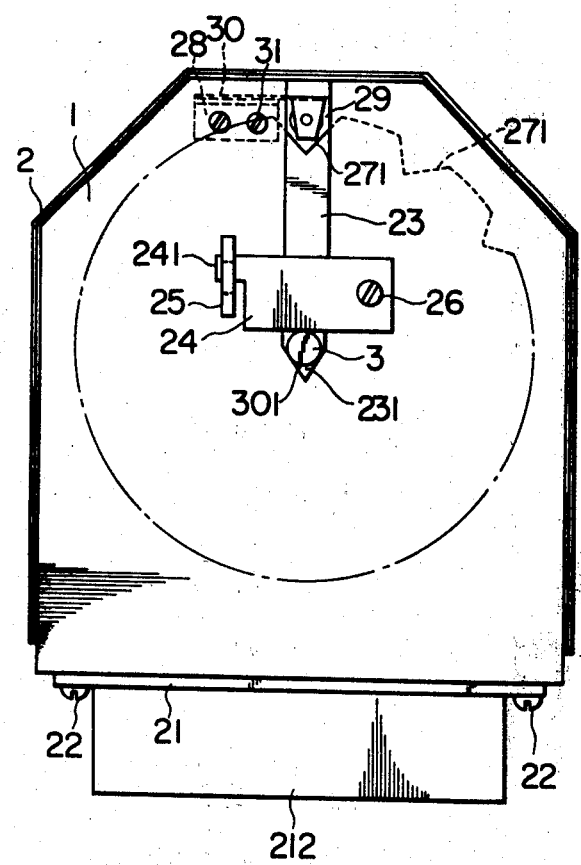
FIG. 2 is a side view of the same tuner.
Figure 5:
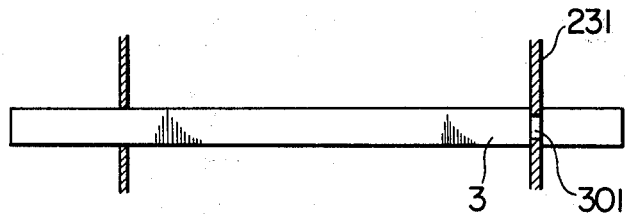

The frame 1 has its opposite side walls formed with respective vertical notches 23 having a V-shaped bottom 231, in which the shaft 3 is received. The shaft 3 is formed at positions corresponding to the V-shaped bottoms 231 with annular grooves 301, which are engaged in the V-shaped bottoms 231 to restrict the axial movement of the shaft 3 (see FIG. 5). Numeral 24 designates keep plates for keeping the shaft 3 in a fixed radial and axial position. Each keep plate 24 has its one end fitted in a raised clamp 25 provided on each side wall of the frame 1 and the other end secured by a set screw 26 to the frame 1. Numeral 27 designates a detent wheel secured to the shaft 3 and having peripherally spaced V-shaped notches 271. A mount 28 carrying a plate spring 30 rotatably supporting a detent roller 29 is secured by set screws 31 to the frame 1. The detent roller 29 is adapted to fall into one of the V-shaped notches 271 formed in the detent wheel 27 when the terminal contacts 16 in a corresponding row come to a position in contact with the substantial center of a contact portion of the respective contact pieces 19, and once the detent roller 29 has fallen into a V-shaped notch 271 the shaft 3 can be rotated only if it receives a torque surpassing the spring force of the plate spring 30 by more than a certain extent. Thus, with the detent roller 29 received in a given V-shaped notch 271, a corresponding one of the receiving circuit blocks for respectively different frequency bands is electrically connected to the high frequency circuit having the variable capacitor 211 and other elements, and this electric connection will not be lost unless a torque in excess of a certain level is exerted to the shaft 3 (see FIG. 2).

As has been made apparent from the foregoing embodiment, since the tuner according to the invention consists of a plurality of cylindrically arranged bases each provided with a plurality of receiving circuit blocks for receiving waves in different frequency bands and constituted by part of the same tuning element, adjustment of plural receiving circuit blocks may be made by removing one of the plurality of bases, which is very beneficial in practice for the operation required for the removal, and remounting of the bases can be greatly saved. Also, since the bases are assembled into a cylindrical form, it is possible to realize considerable size reduction of the tuner as a whole. Further, since unnecessary inductance due to leads is almost eliminated, great improvement of the tuner characteristics can be obtained.

Furthermore, with the component elements of the individual receiving circuit blocks orientated such that the direction of adjustment of their adjustable section sufficiently deviates from the shaft, the adjustment can be made very easily.

What we claim is:

1. A multiple band tuning system, comprising:
    a pair of mutually-facing support plates mounted on a rotatable shaft;
    a plurality of base members, each having an arcuately-shaped outer surface;
    means releasably mounting said base members to said support plates, said base members forming a substantially cylindrical outer surface when mounted to said support plates;
    a plurality of frequency tuning printed circuit bases mounted on the inner surface of each base member; said circuit bases each having a frequency tuning circuit mounted thereon for tuning a given frequency,
    a plurality of electrical contact members connected to each said printed circuit base and extending to the outer arcuate surface of the base member on which said circuit base is mounted; and
    contact means mounted on a frame for engaging corresponding contact members on said base members to connect a predetermined one of said frequency tuning circuits to a further circuit mounted on said frame;
    whereby said frequency tuning circuits arranged on one of said base members are adjusted by removing another of said base members opposite said one of said base members.

2. A tuner according to claim 1, wherein each said arcuate base member is formed adjacent to its one end with a notch so that it may be readily separated from the support plates secured to the shaft by forcing it in one axial direction by means of a driver inserted in said notch.

3. A multiple tuning system according to claim 1, wherein said electrical contact members are fixed to said base members and are soldered to said printed circuit bases to secure said printed circuit bases to said base members.

4. A multiple tuning system according to claim 1, wherein each said frequency tuning circuit includes at least one adjustable reactance element mounted on its corresponding printed circuit base in such a manner that the axis of adjustment of said reactance element is offset from said rotatable shaft to permit access to said adjustable reactance element by means of an adjusting tool passing through an opening in said cylindrical outer surface opposite the location of said adjustable element.

5. The multiple tuning system according to claim 1, wherein each arcuate base member has a tab at each axial end thereof, one tab being longer than the other, and each support plate has corresponding openings into which said tabs are inserted; said system further comprising spring means mounted on one of said support plates and engaging said longer tabs to normally urge said base member in the direction of the other of said support plates; and a notch formed in said base member adjacent the short tab end thereof wherein said base member is detachable from said support plates by insertion of an unlocking means into said notch to urge said base member against the normal bias force of said spring means until said short tab becomes disengaged from the corresponding opening in said other support plate.

6. A multiple band tuning system, comprising:
    a pair of mutually-facing support plates mounted on a rotatable shaft;
    a plurality of base members, each having an arcuately-shaped outer surface, wherein each arcuate base member has a tab at each axial end thereof, one tab being longer than the other, and each support plate has corresponding openings into which said tabs are inserted;
    means releasably mounting said base members to said support plates, said base members forming a substantially cylindrical outer surface when mounted to said support plates;
    a plurality of frequency tuning printed circuit bases mounted on each base member, said circuit bases each having a frequency tuning circuit mounted thereon for tuning a given frequency;

a plurality of electrical contact members connected to each said printed circuit base and extending to the outer arcuate surface of the base member on which said circuit base is mounted;

contact means mounted on a frame for engaging corresponding contact members on said base members to connect a predetermined one of said frequency tuning circuits to a further circuit mounted on said frame;

spring means mounted on one of said support plates and engaging said longer tabs to normally urge said base member in the direction of the other of said support plates; and a notch formed in said base member adjacent the short tab end thereof, wherein said base member is detachable from said support plates by insertion of an unlocking means into said notch to urge said base member against the normal bias force of said spring means until said short tab becomes disengaged from the corresponding opening in said other support plate.

* * * * *